United States Patent [19]
Lu

[11] Patent Number: 5,814,552
[45] Date of Patent: Sep. 29, 1998

[54] HIGH STEP PROCESS FOR MANUFACTURING ALIGNMENT MARKS FOR TWIN-WELL INTEGRATED CIRCUIT DEVICES

[75] Inventor: Bing-Yau Lu, Chungho, Taiwan

[73] Assignee: Holtek Microelectronics, Inc., Hsinchu, Taiwan

[21] Appl. No.: 741,630

[22] Filed: Nov. 1, 1996

[30] Foreign Application Priority Data

Sep. 26, 1996 [TW] Taiwan ................... 85111802

[51] Int. Cl.⁶ .......................... H01L 27/00; H01L 27/265
[52] U.S. Cl. .......................... 438/584; 438/584; 438/401; 438/975; 438/694; 438/703; 430/22; 430/312; 148/DIG. 102; 148/DIG. 70
[58] Field of Search ................ 430/22, 312; 437/228, 437/228 M, 228 MRK; 148/DIG. 102; 438/401, 694, 703, 975, 584

[56] References Cited

U.S. PATENT DOCUMENTS

| | | | |
|---|---|---|---|
| 4,938,841 | 7/1990 | Shahar et al. | 156/661.1 |
| 5,002,902 | 3/1991 | Watanabe | 438/975 |
| 5,091,332 | 2/1992 | Bohr et al. | 438/450 |
| 5,132,241 | 7/1992 | Su | 438/228 |
| 5,252,510 | 10/1993 | Lee et al. | 438/401 |
| 5,300,797 | 4/1994 | Bryant et al. | 257/206 |
| 5,406,373 | 4/1995 | Kamon | 356/401 |
| 5,679,588 | 10/1997 | Choi et al. | 438/401 |

OTHER PUBLICATIONS

Wolf et al., Silicon Processing for The VLSI Era, vol. 2, pp. 428–431, 1986.

S. Wolf. Silicon Processing for the VLSI Era, vol. 2: Process Integration, p. 431, 1990.

*Primary Examiner*—Charles L. Bowers, Jr.
*Assistant Examiner*—Thanh Nguyen
*Attorney, Agent, or Firm*—W. Wayne Liauh

[57] ABSTRACT

A method of fabricating high step alignment marks on a twin-well integrated circuit. An alignment mark photoresist pattern is formed overlaying the nitride layer using lithography technique. The nitride layer is partially etched to form a nitride alignment pattern using the alignment mark photoresist pattern as a mask. After the formation of N-well and P-well regions using lithography technique, the N-doped and P-doped impurities are subject to a thermally drive in process to activate and form N-well and P-well regions, respectively. At the same time, the pad oxide layer overlaying the N-well and P-well regions and the region not covered by the nitride alignment pattern is converted to a thermal oxide layer. The thermal oxide layer can be removed to reveal a recessed portion on the surface of the P-type silicon substrate, whereby the thickness of the nitride layer plus the depth of the recessed portion causes high step alignment marks to be formed.

8 Claims, 4 Drawing Sheets

HIGH STEP PROCESS FOR MANUFACTURING ALIGNMENT MARKS FOR TWIN-WELL INTEGRATED CIRCUIT DEVICES

BACKGROUND OF THE INVENTION (a) Field of the Invention

The present invention relates to the fabrication of alignment marks in a twin-well integrated circuit device, and more particularly to a method of fabricating high-step alignment marks for twin-well integrated circuit devices.

(b) Description of the Prior Art

There are ruggedness topographes within an integrated circuit device structure, and these ruggedness topographies can be used as alignment marks during the lithography steps. For example, the field oxide isolation layer has a thickness of about 1000 to 3000 Angstroms above the silicon substrate, that can be used as the succeeding polysilicon gate alignment marks. Furthermore, the silicon oxide layer formed during twin-well drive in process can also serve as alignment mark for the following lithography steps. The U.S. Pat. No. 5,406,373 to Kamon described such an alignment method for the metal layers in a VLSI manufacturing process.

In order to obtain enough height difference alignment marks and the substrate for better accuracy, it usually increases the well drive in time to form thicker silicon oxide layer. Various problems are encountered during long well drive-in process, for example, the dopants diffuse too deep inside substrate. U.S. Pat. No. 5,460,984 to Yoshida described such problems for twin-well integrated circuit devices.

SUMMARY OF THE INVENTION

It is a prime object of the present invention to provide a novel twin-well alignment mark manufacturing method.

It is another object of the present invention to provide a method of fabricating high step alignment mark of a twin-well integrated circuit.

It is a further object of the present invention to provide a method of fabricating the alignment marks even utilizing shorter well drive-in process.

According to the present invention, first, the pad oxide layer and the nitride layer are formed in a P-type semiconductor substrate.

Next, the alignment mark photoresist pattern is formed by the conventional lithography technique. After the photoresist is developed, the whole area is clear field except the alignment mark photoresist pattern which is in dark field. By using the alignment mark photoresist pattern as a mask, the nitride layer pattern is formed by plasma-etching method.

Then, the N-well photoresist pattern is formed by lithography technique again. By using the N-well photoresist pattern as a mask this time, N-type ions are implanted into the P-type substrate through the pad oxide layer to form an N-doped region. Thereafter, the N-well photoresist pattern is removed.

Next, the P-well photoresist pattern is formed by the conventional lithography method again. Using the P-well photoresist pattern as a mask, P-type ions are implanted into the P-type substrate through the pad oxide layer to form a P-doped region. After ion implantation, the P-well photoresist pattern is stripped.

Next, the impurities in the N-doped and P-doped regions are thermally driven in a high-temperature environment to form the desired depths of N-well and P-well. During the high-temperature drive-in process, an oxide layer is formed on the surface of N-well, P-well and nitride regions simultaneously.

Finally, the oxide layer on the surface of N-well, P-well and nitride regions is removed, apparent position deviation due to the formation of the oxide film is occurred. The height of the substrate surface with recessed portion plus the thickness of the nitride layer is then formed high step regions which have enough height difference to be used as alignment marks even for shallow well drive-in process, that is the key point of the present invention.

BRIEF DESCRIPTION OF THE DRAWINGS

In the accompanying drawing forming a material part of this description, there is shown:

FIG. 1 is a cross-sectional view of silicon substrate after the pad oxide layer and nitride layer are formed.

FIG. 2 is a cross sectional view of FIG. 1 after the alignment mark photoresist pattern is formed.

FIG. 3 is a cross sectional view of FIG. 2 after the nitride layer is patterned by plasma-etching technique.

FIG. 4 is a cross sectional view of FIG. 3 after the N-doped region is formed by ion implantation.

FIG. 5 is a cross sectional view of FIG. 4 after the P-doped region is formed by ion implantation.

FIG. 6 is a cross sectional view of FIG. 5 after the second photoresist pattern is removed.

FIG. 7 is a cross sectional view of FIG. 6 after the impurities are driven in and the silicon oxide layer is formed.

FIG. 8 is a cross sectional view of FIG. 7 after the silicon oxide layer is removed to form high step alignment mark regions.

DESCRIPTION OF THE PREFERRED EMBODIMENT

The invention discloses herein is directed to a method of fabricating twin-well alignment mark of an integrated circuit device. In th following description, numerous details are set forth in order to provide a thorough understanding of the present invention. It will be obvious, however, to one skilled in the art of integrated circuits that specific details can be changed to practice the present invention. For example, the particular embodiment of the present invention use a P-type substrate which can be substitute for an N-type substrate as well. In other instance, well-known processing steps are not described in detail in order not unnecessarily to obscure the present invention.

Figure 1:
FIG. 1 through 8 schematically illustrate in cross-sectional representation one preferred embodiment of this invention.

Referring now more particularly to FIG. 1, the pad oxide layer 3 and the nitride layer 5 are continuously formed on a P-type semiconductor silicon substrate 1. The pad oxide layer 3 which has a thickness of about 320 to 380 Angstroms is usually formed under 1000° C. thermal oxidation environment. The nitride layer 5 which has a thickness of 1350 to 1650 Angstroms is formed by low pressure chemical vapor deposition (LPCVD) technique under the following conditions: the base pressure is about 350 mTorr, with a temperature of about 760° C., and reactant gases $SiH_2Cl_2$ and $NH_3$ flowing.

Figure 2:
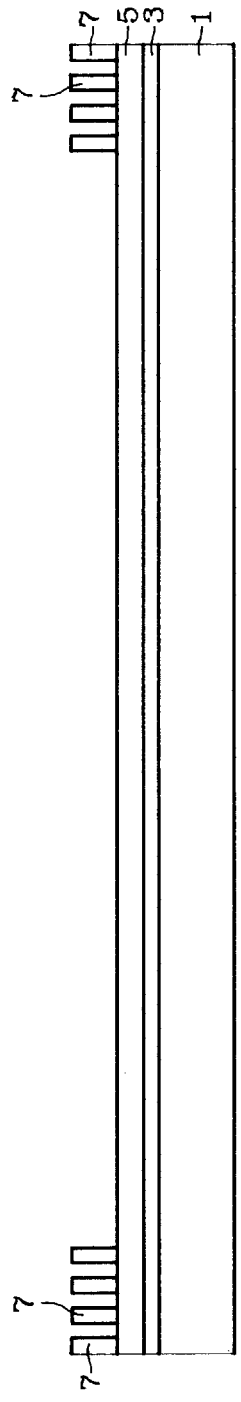

Referring now to FIG. 2, the photoresist layer which is coated overlaying the nitride layer 5, is selectively formed to form the alignment mark pattern 7 by the conventional lithography technique. After the photoresist pattern 7 is developed, the whole substrate area is in clear field, while the alignment mark pattern is in dark field.

Figure 3:
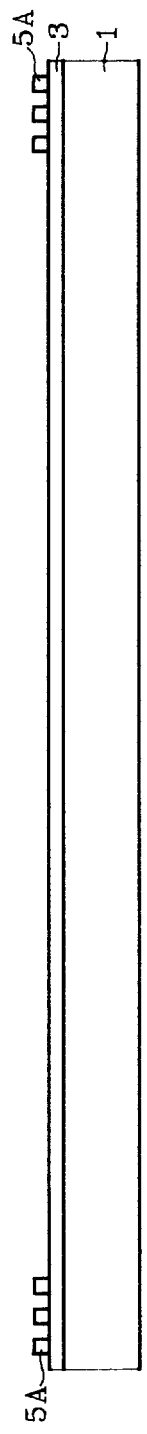

Referring now to FIG. 3, by using the alignment mark pattern 7 as a mask, the nitride layer 5 is partially etched by plasma-etching technology to form nitride alignment pattern 5A. The plasma-etching process can use magnetic enhanced reactive ion etching (MERIE), electron cyclotron etching (ECR), or conventional reactive ion etching (RIE) methods. According to the present invention, it uses the MERIE method with reactant gases of $CF_4$, $CHF_3$, Ar and $O_2$.

Figure 4:
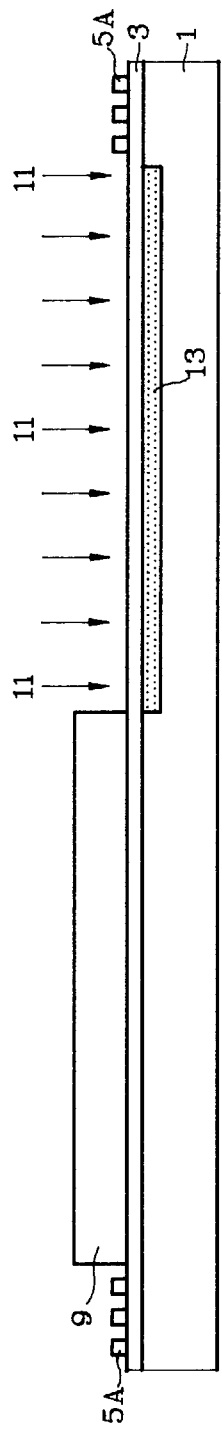

Referring now to FIG. 4, the N-well photoresist pattern 9 is formed similarly by lithographic technique. By using N-well photoresist pattern 9 as a mask, N-type ion beams 11 are implanted into the P-type silicon substrate 1 to form an N-doped region 13 as shown is FIG. 4. The N-type impurities which are ion implanted into the P-type substrate are preferred to use Phosphorus ($P^{31}$) ions, with an implantation energy of 50 to 150 keV, and an implantation dose of $10^{11}$ to $10^{13}$ cm$^{-2}$.

Figure 5:
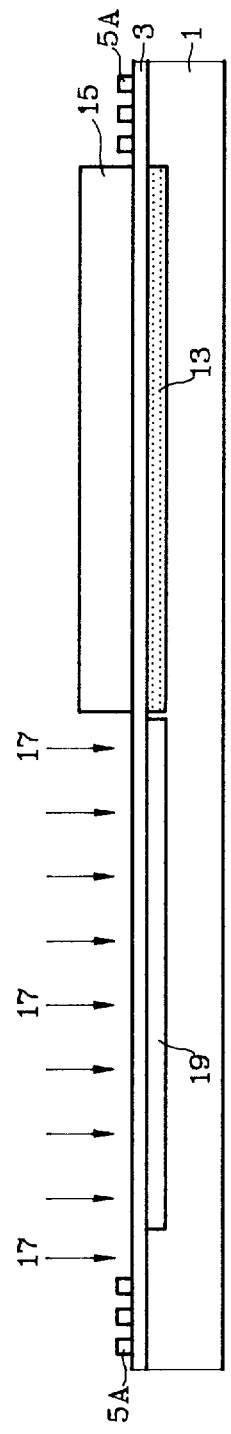

Referring now to FIG. 5, the P-well photoresist pattern 15 is similarly formed by lithography technique. By using P-well photoresist pattern 15 as a mask, P-type ion beams 17 are implanted into the P-type silicon substrate 1 to form a P-doped region 19 as shown is FIG. 5. The P-type impurities which are ion implanted into the P-type substrate are preferred to use Boron ($B^{11}$) ions, or borondiflouride ($BF_2$), with an implantation energy of 10 to 80 keV, and an implantation dose of $10^{12}$ to $10^{13}$ cm$^{-2}$.

Figure 6:
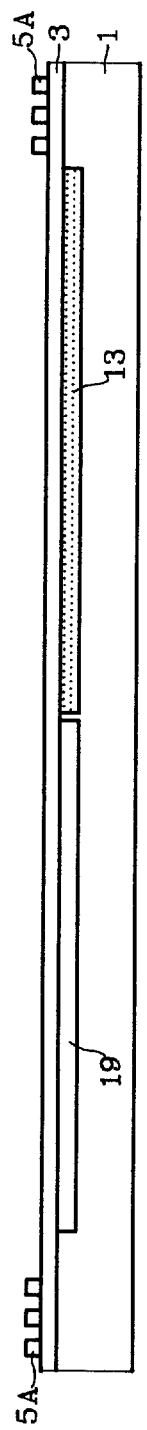

Referring now to FIG. 6, the P-well photoresist pattern 15 is removed.

Figure 7:
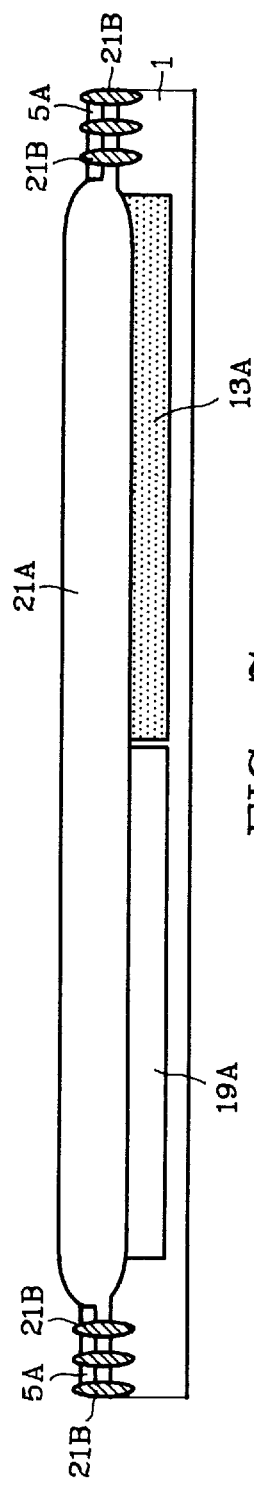

Referring now to FIG. 7, thermally driven-in in a nitrogen and oxygen environment is carried out for the purpose of activating the impurities and obtaining the desired well depths, to thereby form an N-well region 13A and a P-well region 19A, and thus a twin-well. At the same time, the thermal oxide layer 21A overlaying the twin-well region and the oxide layer 21B not covered by the nitride layer 5A which has a thickness of 2000 to 2400 Angstroms are simultaneously formed during the drive-in process as shown in FIG. 7. The drive-in process is operated in a temperature range of 900° C. to 1200° C. for 400 to 500 minutes.

Figure 8:
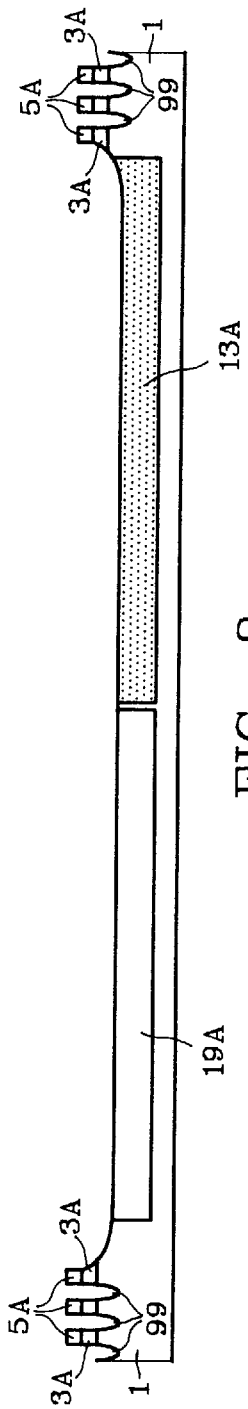

Referring now to FIG. 8, the portion of oxide layer 21A which is overlaying the N-well and P-well regions is removed to form the recessed shape area in the twin-well regions, and, the portion of oxide layer 21B which are located between the nitride patterns 5A are also removed, therefore the pad oxide layer 3 is transferred to pad oxide patterns 3A, as shown in FIG. 8.

Please note that the height of the silicon substrate surface with recessed portion 99 plus the thickness of the nitride patterns 5A are formed the high step regions which can be used as alignment marks for the subsequent lithography process. Since the original thickness of the nitride layer is exited, the oxide layer grown during thermal drive-in process does not have to be very thick. The high step alignment marks can still have enough height even for shorter time shallow drive-in depth well process to align.

Therefore, the new alignment mark fabrication method is particularly suitable for the manufacture of shallow well integrated circuit. After the formation of the alignment marks, the process can be continued for subsequent steps such as isolation or metalization.

While the present invention has been particularly shown and described with reference to a preferred embodiment, it will be understood by those skilled in the art that various changes in forms and details may be made without departing from the spirit and scope of the present invention.

What I claimed is:

1. A method of fabricating high step alignment marks on a twin-well integrated circuit, said method comprising the steps of:

(a) forming a pad oxide layer and a nitride layer on a P-type silicon substrate;

(b) forming an alignment mark photoresist pattern overlaying said nitride layer using lithography technique;

(c) partially etching said nitride layer to form a nitride alignment pattern using said alignment mark photoresist pattern as a mask;

(d) forming an N-well photoresist pattern using lithography technique;

(e) ion implanting N-type impurities through said pad oxide layer into said P-type silicon substrate to form an N-doped region;

(f) removing said N-well photoresist pattern;

(g) forming a P-well photoresist pattern using lithography technique;

(h) ion implanting P-type impurities through said pad oxide layer into said P-type silicon substrate to form a P-doped region;

(i) removing said P-well photoresist pattern;

(j) thermally driving in so as to activate said N-doped and P-doped impurities to form N-well and P-well regions, respectively; and simultaneously causing the pad oxide layer overlaying said N-well and P-well regions and the region not covered by said nitride alignment pattern to become thermal oxide layer;

(k) removing said thermal oxide layer to reveal a recessed portion on the surface of said P-type silicon substrate, whereby the thickness of said nitride layer plus the depth of said recessed portion causes high step alignment marks to be formed.

2. The method of claim 1, wherein said pad oxide layer has a thickness of about 320 to 380 Angstroms.

3. The method of claim 1, wherein said nitride layer which has a thickness of about 1350 to 1650 Angstroms, is formed by low pressure chemical vapor deposition (LPCVD) technique.

4. The method of claim 1, wherein said N-doped region which is formed by ion implantation technique, is doped with Phosphorus ($P^{31}$) ions, with an implantation energy of 50 to 150 keV, and an implantation dose of $10^{11}$ to $10^{13}$ cm$^{-2}$.

5. The method of claim 1, wherein said P-doped region which is formed by ion implantation technique, is doped with boron ($B^{11}$) or bordifluoride ($BF_2$) ions, with an implantation energy of 10 to 80 keV, and an implantation dose of $10^{12}$ to $10^{13}$ cm$^{-2}$.

6. The method of claim 1, wherein said thermally drive-in is operate in the temperature range of 900° to 1200° C. for about 400 to 500 minutes.

7. The method of claim 1, wherein said alignment mark photoresist pattern is in dark field, otherwise is in clear field.

8. The method of claim 1, wherein said a P-type silicon substrate can be replaced by an N-type silicon substrate.

* * * * *